(12) United States Patent
Shrivastava et al.

(10) Patent No.: US 12,394,693 B2
(45) Date of Patent: Aug. 19, 2025

(54) INTEGRATED CIRCUIT PACKAGE WITH STAR-CONNECTED LEAD

(71) Applicant: TEXAS INSTRUMENTS INCORPORATED, Dallas, TX (US)

(72) Inventors: Kumar Anurag Shrivastava, Bangalore (IN); Arushi Agrawal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 535 days.

(21) Appl. No.: 17/854,526

(22) Filed: Jun. 30, 2022

(65) Prior Publication Data

US 2024/0006273 A1   Jan. 4, 2024

(51) Int. Cl.
*H01L 23/495* (2006.01)
*H01L 21/48* (2006.01)
*H01L 23/00* (2006.01)

(52) U.S. Cl.
CPC .... *H01L 23/49541* (2013.01); *H01L 21/4821* (2013.01); *H01L 23/49548* (2013.01); *H01L 23/49575* (2013.01); *H01L 24/48* (2013.01); *H01L 2224/48245* (2013.01); *H01L 2924/1431* (2013.01); *H01L 2924/30107* (2013.01)

(58) Field of Classification Search
CPC ......... H01L 23/49541; H01L 23/49575; H01L 23/49548
See application file for complete search history.

(56) References Cited

FOREIGN PATENT DOCUMENTS

| CN | 115632045 A | * | 1/2023 | |
|---|---|---|---|---|
| CN | 117038620 A | * | 11/2023 | ......... H01L 21/4821 |

\* cited by examiner

*Primary Examiner* — David A Zarneke
(74) *Attorney, Agent, or Firm* — Ronald O. Neerings; Frank D. Cimino

(57) ABSTRACT

An example packaged IC includes a lead frame having a supply pin and a ground pin. The supply pin includes first and second supply leads extending from a proximal portion of the supply pin. The ground pin includes first and second ground leads extending from a proximal portion of the ground pin. A first IC network has a first supply terminal coupled to the first supply lead via a first conductor (e.g., bond wire or bump bond). The first IC network also has a first ground terminal coupled to the first ground lead via a second conductor. A second IC network has a second supply terminal coupled to the second supply lead via a third conductor. The second IC network also has a second ground terminal coupled to the second ground lead via a fourth conductor.

15 Claims, 8 Drawing Sheets

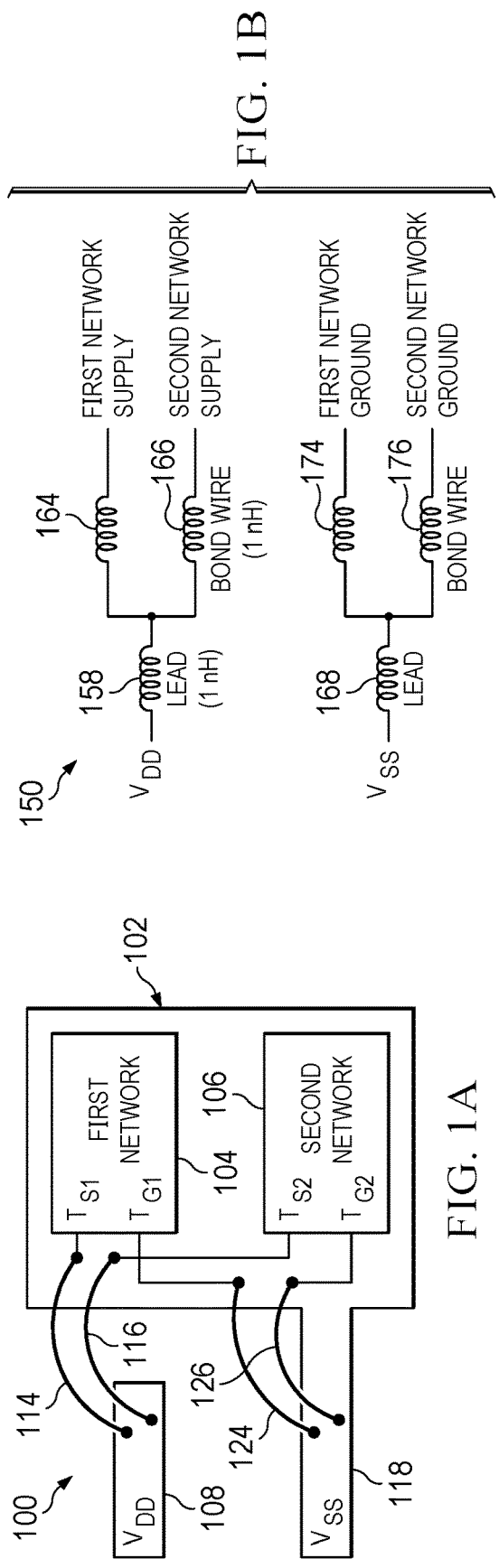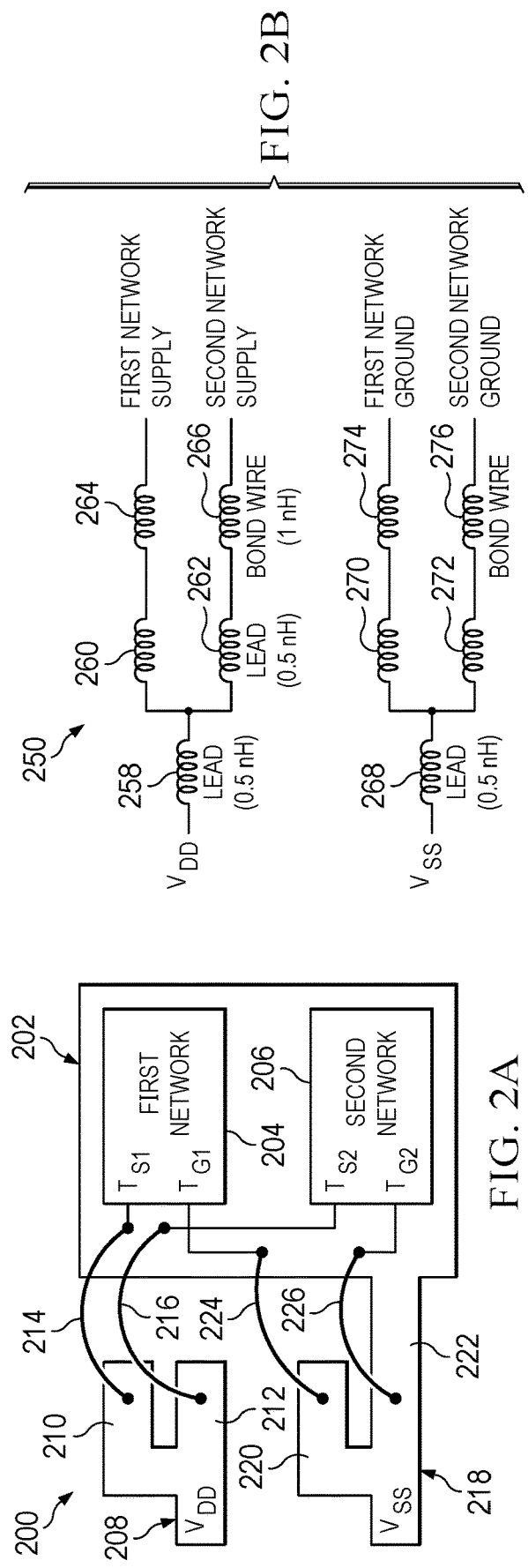
FIG. 1A
FIG. 1B
FIG. 2A
FIG. 2B

ICAL FIELD

INTEGRATED CIRCUIT PACKAGE WITH STAR-CONNECTED LEAD

TECHNICAL FIELD

This description relates generally to electrical devices, and more particularly to an integrated circuit (IC) package with a star-connected lead.

BACKGROUND

An integrated circuit (IC), fabricated, for example, as a die cut from a semiconductor wafer, can be put into a protective package to provide damage protection and to facilitate handling and assembly onto a printed circuit board (PCB).

A lead frame is a structure inside an IC package that carries signals from an IC die inside the package to the outside of the package. A lead frame can include, for example, a central die pad, upon which the die is glued or soldered; bond pads, where bond wires are placed to connect the die to parts inside of the package and outside of the die; metal leads that connect the inside of the package with the outside; and mechanical connections to fix these parts inside a frame structure. The coupled die and lead frame can be molded in molding compound to form the completed IC package.

SUMMARY

An example packaged IC includes a lead frame and first and second IC networks conductively coupled to the lead frame. The lead frame has a supply pin and a ground pin. The supply pin includes first and second supply leads extending from a proximal portion of the supply pin. The ground pin includes first and second ground leads extending from a proximal portion of the ground pin. The first IC network has a first supply terminal and a first ground terminal. A first conductor is coupled between the first supply terminal and the first supply lead. A second conductor is coupled between the first ground terminal and the first ground lead. The second IC network has a second supply terminal and a second ground terminal. A third conductor is coupled between the second supply terminal and the second supply lead. A fourth conductor coupled between the second ground terminal and the second ground lead.

An example method of manufacturing a packaged IC includes forming a lead frame including a supply pin and a ground pin each having a distal end and a proximal end. The supply pin is divided into at least first and second supply leads on the proximal end of the supply pin. The ground pin is divided into at least first and second ground leads on the proximal end of the ground pin. A first supply terminal of a first IC network is conductively coupled to the first supply lead via a first conductor (e.g., bond wire or bump bond). A first ground terminal of the first IC network is conductively coupled to the first ground lead via a second conductor. A second supply terminal of a second IC network is conductively coupled to the second supply lead via a third conductor. A second ground terminal of the second IC network is conductively coupled to the second ground lead via a fourth conductor.

An example lead frame includes first and second supply pins and first and second ground pins. The first supply pin and the first ground pin are both on a first side of the lead frame, and each has a distal end and a proximal end. The first supply pin is bifurcated into first and second supply leads on the proximal end of the first supply pin. The first ground pin is bifurcated into first and second ground leads on the proximal end of the first ground pin. The second supply pin and the second ground pin are both on a second side of the lead frame, and each has a distal end and a proximal end. The second supply pin is bifurcated into third and fourth supply leads on the proximal end of the second supply pin. The second ground pin is bifurcated into third and fourth ground leads on the proximal end of the second ground pin. The proximal ends of the first supply pin and the first ground pin are configured to be coupled to a first IC die. The proximal ends of the second supply pin and the second ground pin are configured to be coupled to a second IC die.

BRIEF DESCRIPTION OF THE DRAWINGS

FIG. 1A is a diagram of first and second networks having connections to common supply and ground lead frame pins.

FIG. 1B is a circuit diagram of inductances of the leads and bond wires of the connections to the common supply and ground lead frame pins of FIG. 1A.

FIG. 2A is a diagram of first and second networks having connections to common supply and ground lead frame pins that are bifurcated into separate leads for each of the first and second networks to connect to.

FIG. 2B is a circuit diagram of inductances of the leads and bond wires of the connections to the common supply and ground lead frame pins of FIG. 2A.

FIG. 7 is a diagram of first through fourth networks having connections to common supply and ground lead frame pins that are divided into separate leads for each of the first through fourth networks to connect to.

DETAILED DESCRIPTION

Figure 3A:
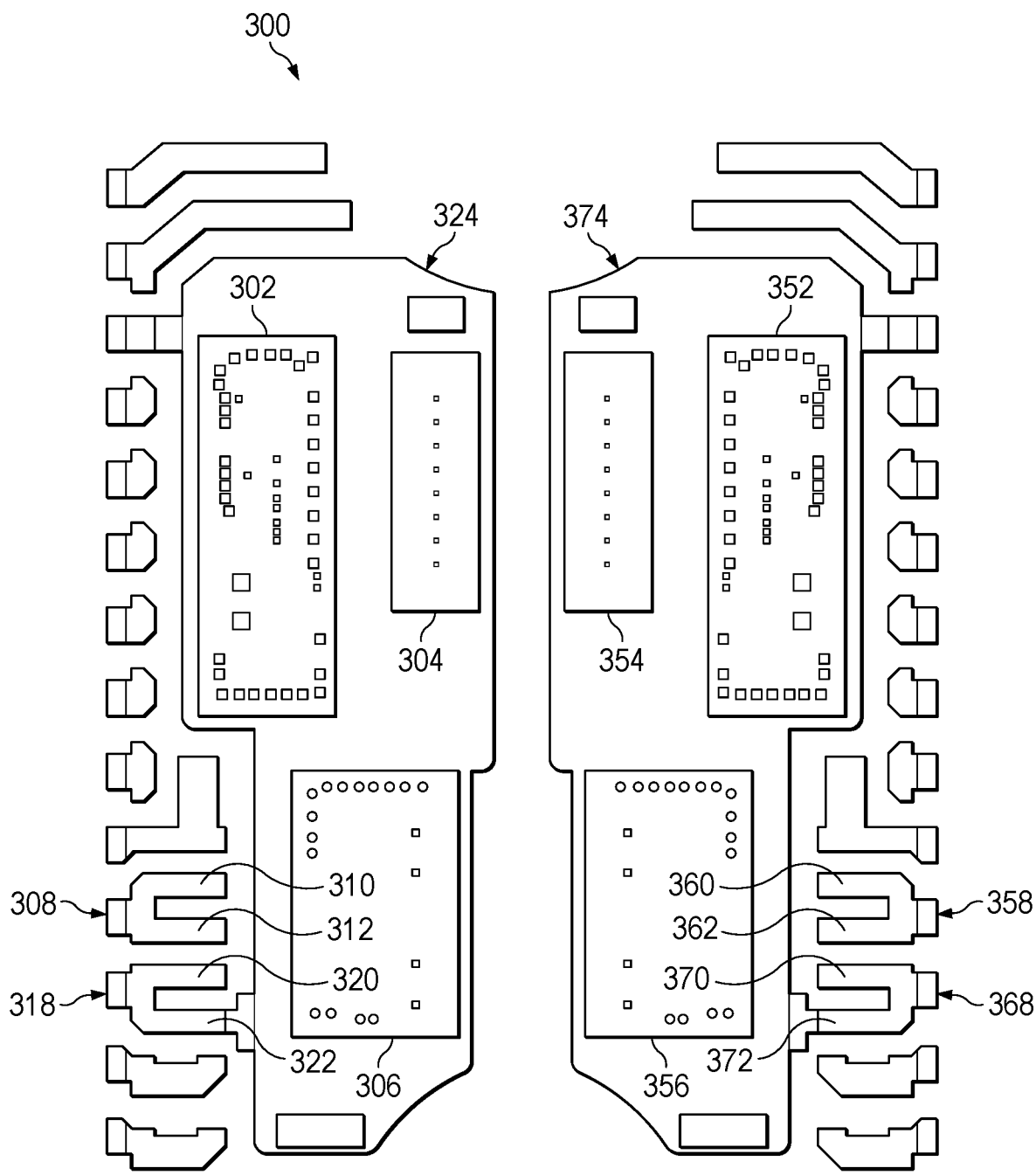
FIG. 3A is a top-down view of an example lead frame for an isolated universal serial bus (USB) repeater having supply and ground lead frame pins that are bifurcated into separate leads.

Electronic networks in a packaged IC can be isolated from each other so that the noise associated with a first of the networks has a reduced effect on a second of the networks. One way of providing such isolation is with star-connected leads in a lead frame to which the networks are conductively coupled.

FIG. 1A shows an example portion 100 of an IC package having a lead frame 102 to which first network 104 and second network 106 are conductively coupled. The first and second networks 104, 106 can be electrical circuitry, for example, fabricated both in a single semiconductor (e.g., silicon) IC die or in separate IC dies. The lead frame 102 includes a single-lead supply pin 108 and a single-lead ground pin 118, the latter of which is conductively coupled to a ground plane of the lead frame 102 at a proximal end of the ground pin 118. As used herein, "pin" means a conductive connection that is a part of an IC package package and is configured to connect the package to something outside of the package, such as a PCB, at a distal end of the pin. As used herein, "lead" means an extension of a proximal end of a pin, internal to the IC package that includes the pin. As used herein, "ground" does not necessarily mean an earth ground or a circuit ground, but can refer to any voltage that is relatively lower than the supply voltage, including a voltage that is higher or lower than an earth ground or a circuit ground. For example, the supply pin 108 can provide a drain voltage VDD intended to be coupled to a drain of a transistor and the ground pin 118 can provide a source voltage VSS intended to be coupled to a source of a transistor. Distal ends of the supply and ground pins 108, 118 can be configured to be conductively coupled, for example, to a printed circuit board (PCB) as part of a larger system that incorporates the IC package of FIG. 1A and other components.

First network 104 has a first supply terminal $T_{S1}$ that is conductively coupled to the supply pin 108 via a first supply bond wire 114 (as illustrated) or bump bond (not illustrated) or other conductive connection. Second network 106 has a second supply terminal $T_{S2}$ that is conductively coupled to the supply pin 108 via a second supply bond wire 116 (as illustrated) or bump bond (not illustrated) or other conductive connection. First network 104 has a first ground terminal $T_{G1}$ that is conductively coupled to the ground pin 118 via a first ground bond wire 124 (as illustrated) or bump bond (not illustrated) or other conductive connection. Second network 106 has a second ground terminal $T_{G2}$ that is conductively coupled to the ground pin 118 via a second ground bond wire 126 (as illustrated) or bump bond (not illustrated) or other conductive connection. As used herein, "terminal" means a conductive connection that is a part of an IC die and is configured to connect the IC die to something outside of the IC die, such as a lead of an IC package that includes the IC die, via a bond wire, bump bond, or other conductive connection. The first and second networks 104, 106 are distinct networks that each can be on different IC dies or can both be on the same IC die. In an example, first network 104 is in a digital section of a die, and second network 106 is in an analog section of the same die. In another example, first network 104 is in an analog section of a die, and second network 106 is in a digital section of the same die. In yet another example, first network 104 is in a first digital section of a die, and second network 106 is in a second digital section of the same die. In still another example, first network 104 is in a first analog section of a die, and second network 106 is in a second analog section of the same die.

In the example of FIG. 1A, supply noise caused, for example, by heavy inrush current to first network 104 (e.g., at power-up or transient load conditions) can affect the operation of second network 106, or vice versa. Minimization of the common routing between the first and second networks 104, 106 can aid in reducing the impacts of supply noise. However, in the example of FIG. 1A, the supply pin 108 is implemented as a single lead to which both the respective supply terminals $T_{S1}$, $T_{S2}$ of the first and second networks 104, 106 are conductively coupled via the respective supply bond wires 114, 116 (as illustrated) or bump bonds (not illustrated). Similarly, in the example of FIG. 1A, the ground pin 118 is implemented as a single lead to which both the respective supply terminals $T_{G1}$, $T_{G2}$ of the first and second networks 104, 106 are conductively coupled via the respective ground bond wires 124, 126 (as illustrated) or bump bonds (not illustrated).

Inductances for the example configuration of FIG. 1A are illustrated in the schematic diagram 150 of FIG. 1B, with the single supply lead inductance 158 representing the inductance of the single-lead supply pin 108 in FIG. 1A, and with the single ground lead inductance 168 representing the inductance of the single-lead ground pin 118 of FIG. 1A. In the diagram 150, the first network supply bond wire inductance 164 represents the inductance of the first network supply bond wire 114 of FIG. 1A, and the second network supply bond wire inductance 166 represents the inductance of the second network supply bond wire 116 of FIG. 1A. In the diagram 150, the first network ground bond wire inductance 174 represents the inductance of the first network ground bond wire 124 of FIG. 1A, and the second network ground bond wire inductance 176 represents the inductance of the second network ground bond wire 126 of FIG. 1A. Each of these lead inductances 158, 168 and bond wire inductances 164, 166, 174, 176 can be, for example, 1 nanohenry. Any of these inductances 158, 168, 164, 166, 174, 176 can be a source of supply noise, and any inductance that is common to the two networks 104, 106 can be a cause of noise affecting both networks 104, 106 in the package.

Reduction of common lead inductance in a package to zero is not always possible in packages having a limited number of pins and leads. However, by fabricating supply and ground terminals to diverge (e.g., bifurcate) into multiple star-connected leads toward a proximal end within the package, the common portion of the lead can be reduced.

FIG. 2A shows an example portion 200 of an IC package implementing diverging leads to provide improved inter-network noise isolation. First network 204 and second network 206 are conductively coupled to lead frame 202. The first and second networks 204, 206 can be, for example, fabricated in a single semiconductor (e.g., silicon) IC dies or in multiple semiconductor IC dies. The lead frame 202 includes a supply pin 208 that is divided (in the illustrated example, bifurcated) into a first supply lead 210 and a second supply leads 212 on the proximal end of the supply pin 208. The lead frame 202 also includes a ground pin 218 that is divided (in the illustrated example, bifurcated) into a first ground lead 220 and a second ground lead 222 on the proximal end of the ground pin 218. Thus, the supply pin 208 includes a plurality of supply leads 210, 212 extending from a proximal portion of the supply pin to terminate in respective proximal ends thereof. In an example, the supply leads 210, 212 are spaced apart from each other, and extend from a distal lead of the supply pin 208 in a direction toward a portion of the lead frame 202 that couples to the first and second networks 204, 206. The proximal ends of the supply leads 210, 212 are spaced apart from a ground plane of the lead frame 202. The ground pin 218 includes a plurality of ground leads 220, 222 extending from a proximal portion of the ground pin to terminate in respective proximal ends thereof. In an example, the ground leads 220, 222 are spaced apart from each other, and extend from a distal lead of the ground pin 218 in a direction toward a portion of the lead frame 202 that couples to the first and second networks 204, 206. The proximal end of the first ground lead 220 is spaced apart from the ground plane of the lead frame 202. The second ground lead 222 is conductively coupled to the ground plane of the lead frame 202 at a proximal end of the second ground lead 222. Distal ends of the supply and ground pins 208, 218 can be configured to be conductively coupled, for example, to a PCB as part of a larger system that incorporates the IC package of FIG. 2A and other components.

First network 204 has a first supply terminal $T_{S1}$ that is conductively coupled to the first supply lead 210 of the supply pin 208 via a first supply bond wire 214 (as illustrated) or bump bond (not illustrated). Second network 206 has a second supply terminal $T_{S2}$ that is conductively coupled to the second supply lead 212 of the supply pin 208 via a second supply bond wire 216 (as illustrated) or bump bond (not illustrated). First network 204 has a first ground terminal $T_{G1}$ that is conductively coupled to the first ground lead 220 of the ground pin 218 via a first ground bond wire 224 (as illustrated) or bump bond (not illustrated). Second network 206 has a second ground terminal $T_{G2}$ that is conductively coupled to the second ground lead 222 of the ground pin 218 via a second ground bond wire 226 (as illustrated) or bump bond (not illustrated). The first and second networks 204, 206 are distinct electronic networks that each be on different IC dies or can both be on the same IC die. In an example, first network 204 is in a digital section of a die, and second network 206 is in an analog section of the same die. In another example, first network 204 is in an analog section of a die, and second network 206 is in a digital section of the same die. In yet another example, first network 204 is in a first digital section of a die, and second network 206 is in a second digital section of the same die. In still another example, first network 204 is in a first analog section of a die, and second network 206 is in a second analog section of the same die.

Inductances for the example configuration of FIG. 2A are illustrated in the schematic diagram 250 of FIG. 2B, in which the single supply lead inductance 158 of FIG. 1B has been separated, in FIG. 2B, into three supply lead inductances 258, 260, 262. The supply lead inductances 258, 260, 262 respectively represent the inductances of the distal portion of supply pin 208 and the proximal leads 210, 212 in FIG. 2A. Similarly, the single ground lead inductance 168 of FIG. 1B is separated, in FIG. 2B, into three supply lead inductances 268, 270, 272, which respectively represent the inductance of the distal portion of ground pin 218 and the proximal leads 220, 222 in FIG. 2A. Thus, in diagram 250, leads 258, 260, and 262 of pin 208 are star-connected (connected in a star electrical arrangement) with each other, and leads 268, 270, and 272 of pin 218 are star-connected with each other.

In the diagram 250 of FIG. 2B, the first network supply bond wire inductance 264 represents the inductance of the first network supply bond wire 214 of FIG. 2A, and the second network supply bond wire inductance 266 represents the inductance of the second network supply bond wire 216 of FIG. 2A. In the diagram 250, the first network ground bond wire inductance 274 represents the inductance of the first network ground bond wire 224 of FIG. 2A, and the second network ground bond wire inductance 276 represents the inductance of the second network ground bond wire 226 of FIG. 2A. Each of these lead inductances 258, 260, 262, 268, 270, 272 can be, for example, 0.5 nanohenries. Thus, as compared to the lead arrangement shown in FIG. 1A, the lead arrangement shown in FIG. 2A reduces by half the lead inductance common to both first network 204 and second network 206. In the example of FIGS. 2A and 2B, the common lead inductance is reduced from 1 nanohenry on each of the supply and ground ends to 0.5 nanohenries on each of the supply and ground ends. The bifurcated lead inductances 260, 262, 270, 272 are not common to both the first and second networks 204, 206. The bond wire inductances 264, 266, 274, 276 can be, for example, 1 nanohenry each and are also not common to both the first and second networks 204, 206. Thus, as compared to the arrangement shown in FIGS. 1A and 1B, in the arrangement of FIGS. 2A and 2B, sources of supply noise are reduced and heavy inrush current on one of the networks will not affect the operation of the other of the networks as much. The arrangement of FIGS. 2A and 2B thus provides inter-network noise isolation improvement over the arrangement of FIGS. 1A and 1B.

FIG. 3A is a top-down view of an example lead frame 300 having supply lead frame pins 308, 358 and ground lead frame pins 318, 368 that are bifurcated into separate leads. The form of the illustrated lead frame 300 is for a dual in-line package (DIP). The lead frame 300 can be, for example, for an isolated universal serial bus (USB) repeater. Pins and leads of the lead frame 300 can be formed of patterned conductive traces that are of, for example, a metal such as copper, aluminum, or gold. The traces and one or more ground planes (e.g., ground planes 324, 374) can be formed to have two-dimensional contours as shown in FIG. 3A and a thickness in a dimension orthogonal to the plane of FIG. 3A. The example lead frame 300 is bilaterally symmetric with an upstream port side on the left of FIG. 3A and a downstream port side on the right of FIG. 3A. Upstream port side supply pin 308 is divided (in the illustrated example, bifurcated), on a proximal end, into a first supply lead 310 and a second supply lead 312. Upstream port side ground pin 318 is divided (in the illustrated example, bifurcated), on a proximal end, into a first ground lead 320 and a second ground lead 322. Second ground lead 322 is conductively coupled at its proximal end to upstream port side ground plane 324, which has within it areas for connection to IC dies, including areas 302, 304, 306. For example, area 306 can be configured to be conductively coupled to an upstream-port IC die having first and second networks that are desired to be noise-isolated from each other. The first network may exhibit, during operation, high inrush current (e.g., of about 8 milliamps), which can be a source of supply noise that is not desirable for the second network, which may have low jitter requirements and thus may be sensitive to noise.

Figure 3B:
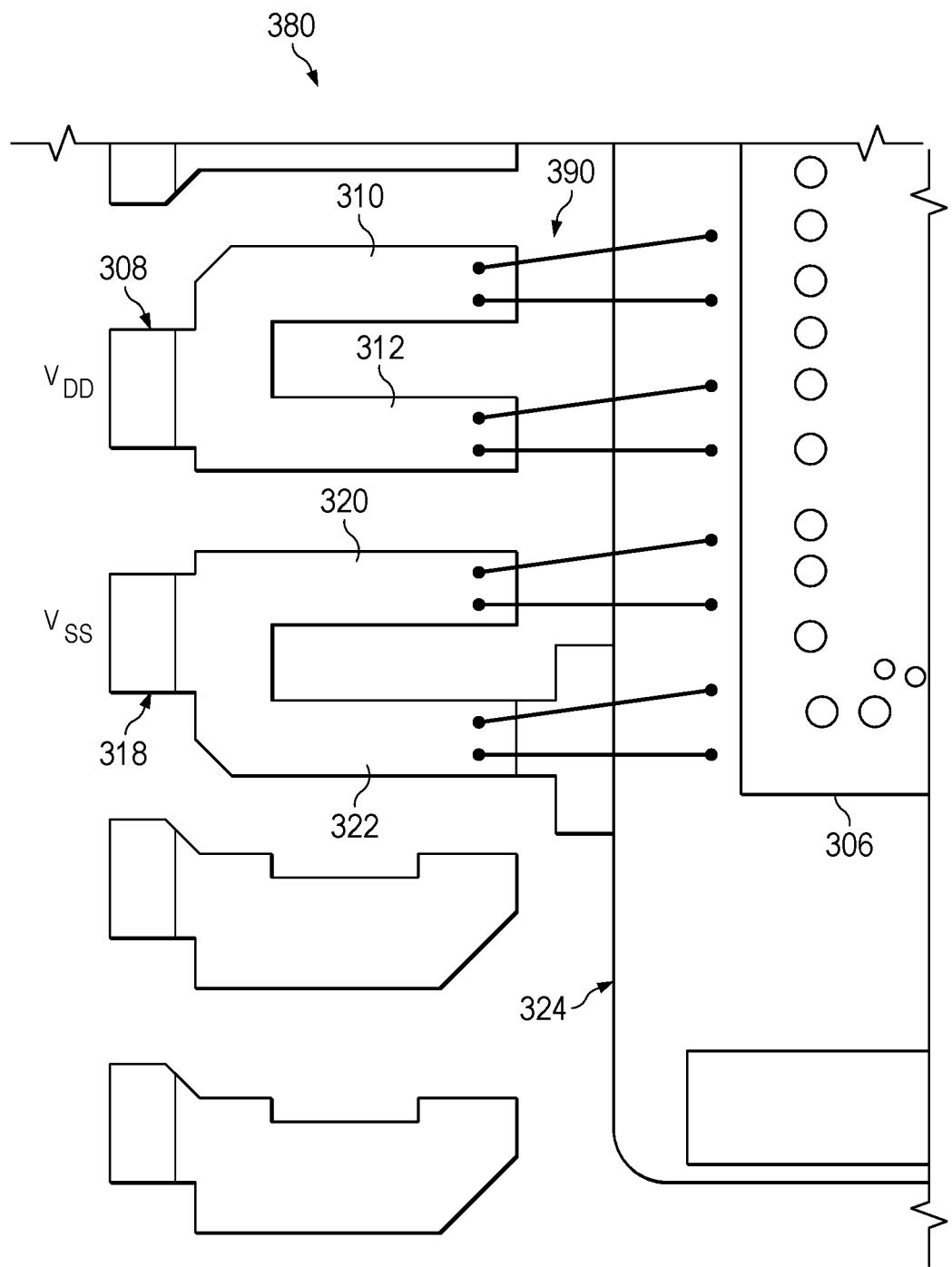
FIG. 3B is a zoomed-in view of bifurcated supply and ground pins of the example lead frame of FIG. 3A.

FIG. 3B shows a zoomed-in view 380 of the bifurcated supply and ground pins 308, 318 of the example lead frame 300 of FIG. 3A. FIG. 3B further illustrates example locations of wire bonds 390, which are omitted from FIG. 3A. As shown in FIG. 3B, the upstream port side circuit supply/ground connection is connected in a star connection to increase the noise immunity of a second network in an IC die coupled to area 306 of the lead frame 300 to noise generated by a first network in the IC die coupled to area 306 of the lead frame 300. This enhanced noise immunity can be achieved even if there is only one dedicated supply voltage pin 308 and only one dedicated ground voltage pin 318 for the upstream port side.

Referring again to FIG. 3A, downstream port side supply pin 358 is divided (in the illustrated example, bifurcated), on a proximal end, into a third supply lead 360 and a fourth supply lead 362. Downstream port side ground pin 368 is divided (in the illustrated example, bifurcated), on a proximal end, into a third ground lead 370 and a fourth ground lead 372. Fourth ground lead 372 is conductively coupled at its proximal end to downstream port side ground plane 374, which has within it areas for connection to IC dies, including areas 352, 354, 356. For example, area 356 can be configured to be conductively coupled to a downstream-port IC die having third and fourth networks that are desired to be noise-isolated from each other. The downstream port side circuit supply/ground connection can be connected in a star connection to increase the noise immunity of a fourth network in an IC die coupled to area 356 of the lead frame 300 to noise generated by a third network in the IC die coupled to area 356 of the lead frame 300. This enhanced noise immunity can be achieved even if there is only one dedicated supply voltage pin 358 and only one dedicated ground voltage pin 368 for the downstream port side.

Figure 4:
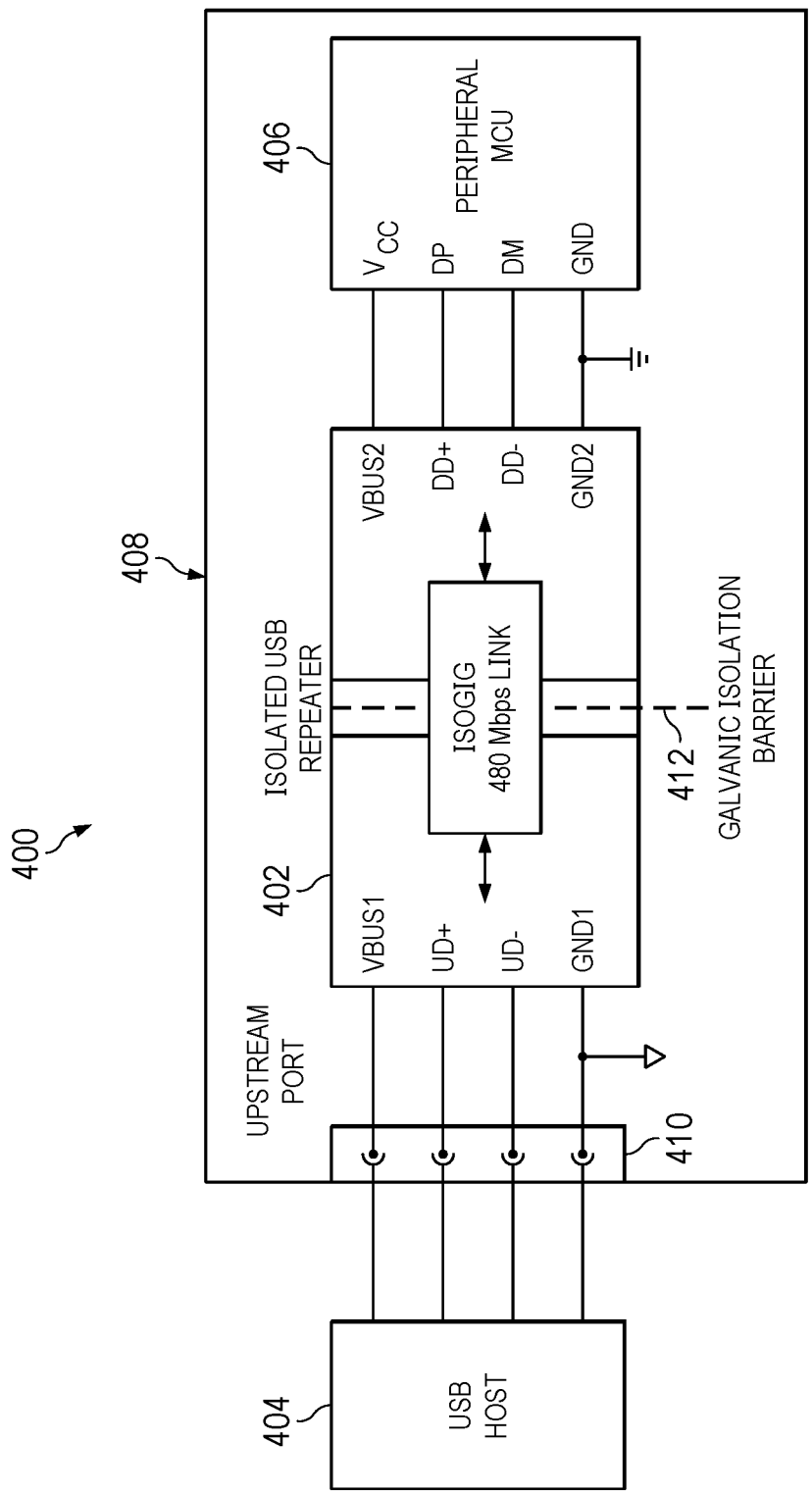
FIG. 4 is a block diagram of an example system including an isolated USB repeater that can include a lead frame like that of FIG. 3A.

FIG. 4 is a block diagram of an example system 400 including an isolated USB repeater 402. In an example, the isolated USB repeater 402 includes a lead frame configured like the lead frame 300 shown in FIG. 3A. Other lead frame configurations can be used in other examples, such as described herein. Isolated USB repeater 402 provides isolation between a USB host 404 and a peripheral microcontroller unit (MCU) 406. The USB host 404 is shown external to a peripheral device 408 and coupled to peripheral device 408 through an upstream port 410. The MCU 406 is shown implemented internal to peripheral device 408. A galvanic isolation barrier 412 isolates the upstream port side of isolated USB repeater 402 from the downstream port side of isolated USB repeater 402. Pins illustrated in FIG. 3A have been omitted from the diagram of FIG. 4 for simplicity. Isolated USB repeater 402 can be, for example, an isolated USB2.0 repeater operating at 480 megabits per second. As examples, peripheral device 408 can be a programmable logic controller (PLC) (an industrial computer that has been ruggedized and adapted for the control of manufacturing processes, such as assembly lines), a motor drive, a medical device such as a continuous positive airway pressure (CPAP) machine, an uninterruptible power supply (UPS), an electricity consumption meter, an automotive electronic device installed in a motor vehicle, a gaming console, a gaming console peripheral, or an in-flight entertainment device installed in an air vehicle.

Figure 5:
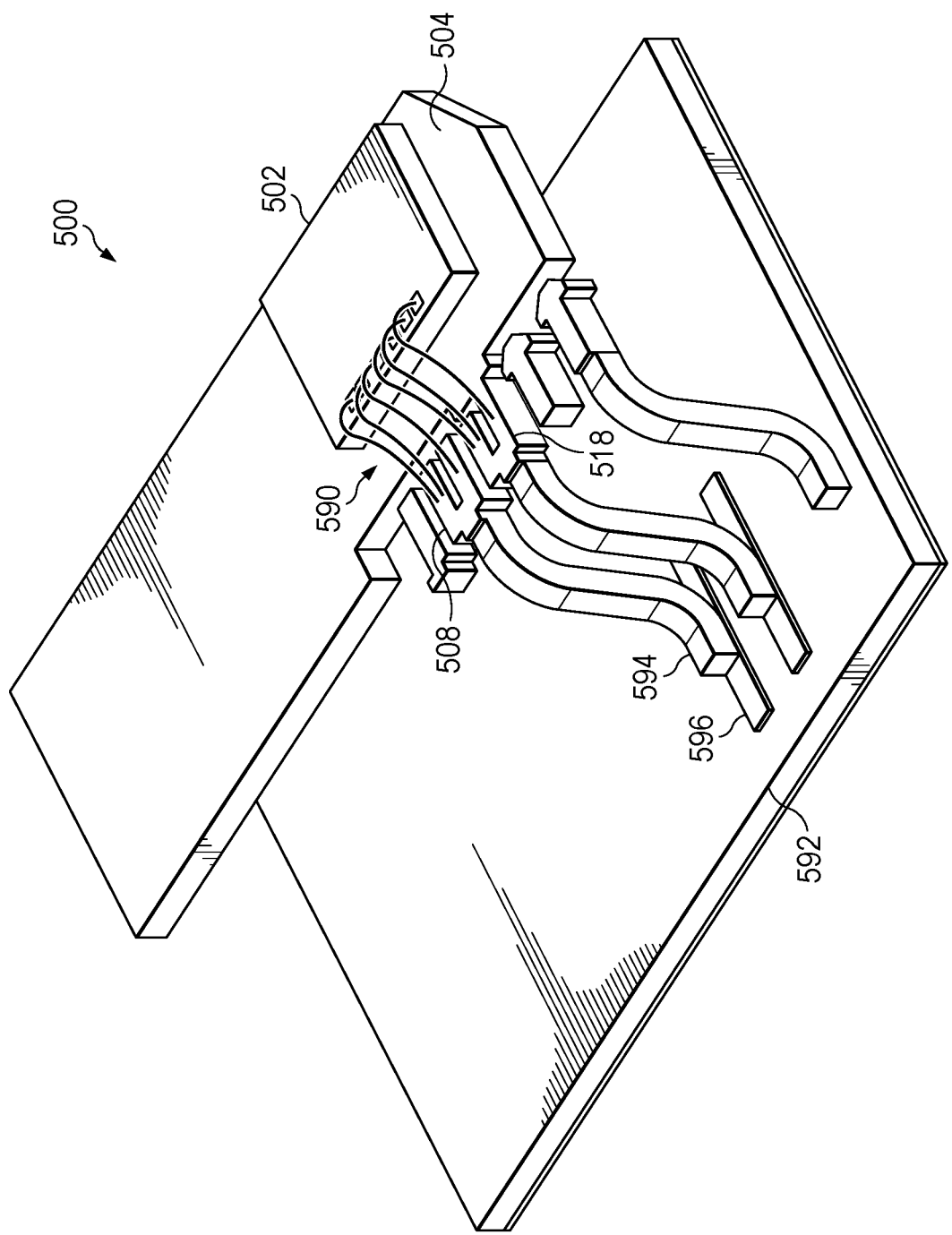
FIG. 5 is an isometric projection view of a portion of an example lead frame having bifurcated supply and ground pins.

FIG. 5 is an isometric projection view of a portion 500 of an example lead frame having a bifurcated supply pin 508 and a bifurcated ground pin 518. For example, the illustrated lead frame portion 500 can correspond to the upstream port side of lead frame 300 in FIG. 3A, with ground plane 504 of lead frame 500 corresponding to ground plane 324 of FIG. 3A. FIG. 5 also shows an IC die 502 coupled to an area of the lead frame 500 corresponding to area 306 in FIG. 3A. Supply and ground terminals of IC die 502 are respectively star-connected to bifurcated proximal portions of the supply and ground pins 508, 518 via wire bonds 590. FIG. 5 also shows a portion of a board 592, such as a PCB, to which the lead frame 500 can be conductively coupled. For example, supply pin 508 can be conductively coupled via a distal end 594 of supply pin 508 to a supply terminal 596 on board 592. Board 592 provides supply and ground voltages to IC die 502 through supply and ground pins 508, 518 and respective ones of the wire bonds 590. IC die 502 can have first and second networks that are advantageously supply noise isolated by the use of bifurcated supply and ground pins 508, 518, as described above.

Figure 6:
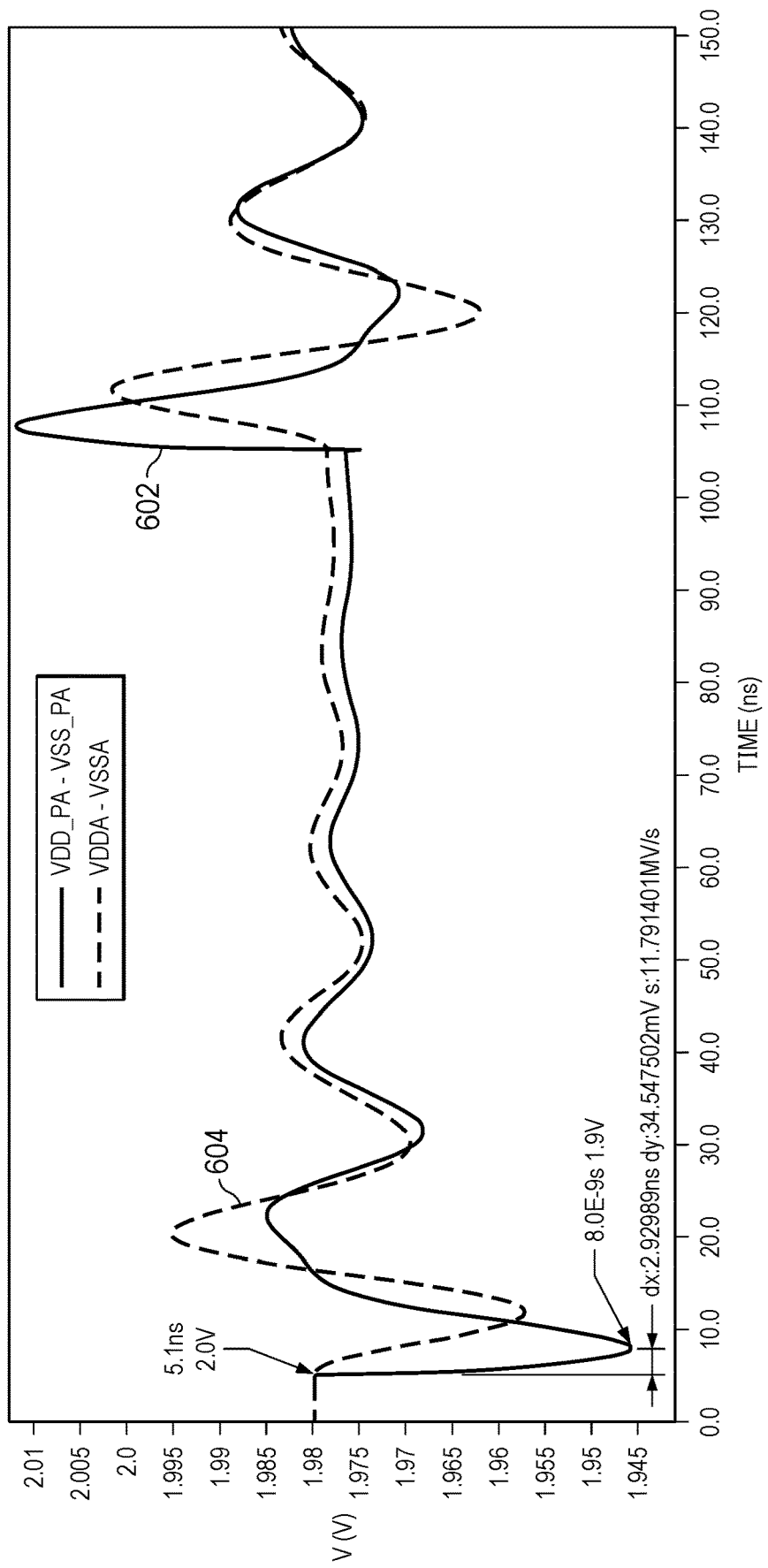
FIG. 6 is a graph showing an example noise reduction benefit of an example lead frame having bifurcated supply and ground pins like that of FIGS. 3A and 5.

FIG. 6 is a graph showing an example noise reduction benefit of an example lead frame having bifurcated supply and ground pins such as shown in FIGS. 3A and 5. The graph of FIG. 6 is a simulation result that shows transient supply noise experienced by a second network that is caused by heavy inrush current in a first network coupled to the same supply and ground pins, first at about 5.1 nanoseconds and again at about 105.1 nanoseconds. Ringing waveform plot 602 illustrates the supply noise amplitude at the second network in an arrangement like that of FIGS. 1A and 1B. Ringing waveform plot 604 illustrates the supply noise amplitude at the second network in a star-connected lead arrangement like that of FIGS. 2A and 2B. The graph of FIG. 6 thus illustrates noise isolation improvement attained by the use of star-connected leads as in FIGS. 2A and 2B as compared to the arrangement of FIGS. 1A and 1B.

Figure 7:
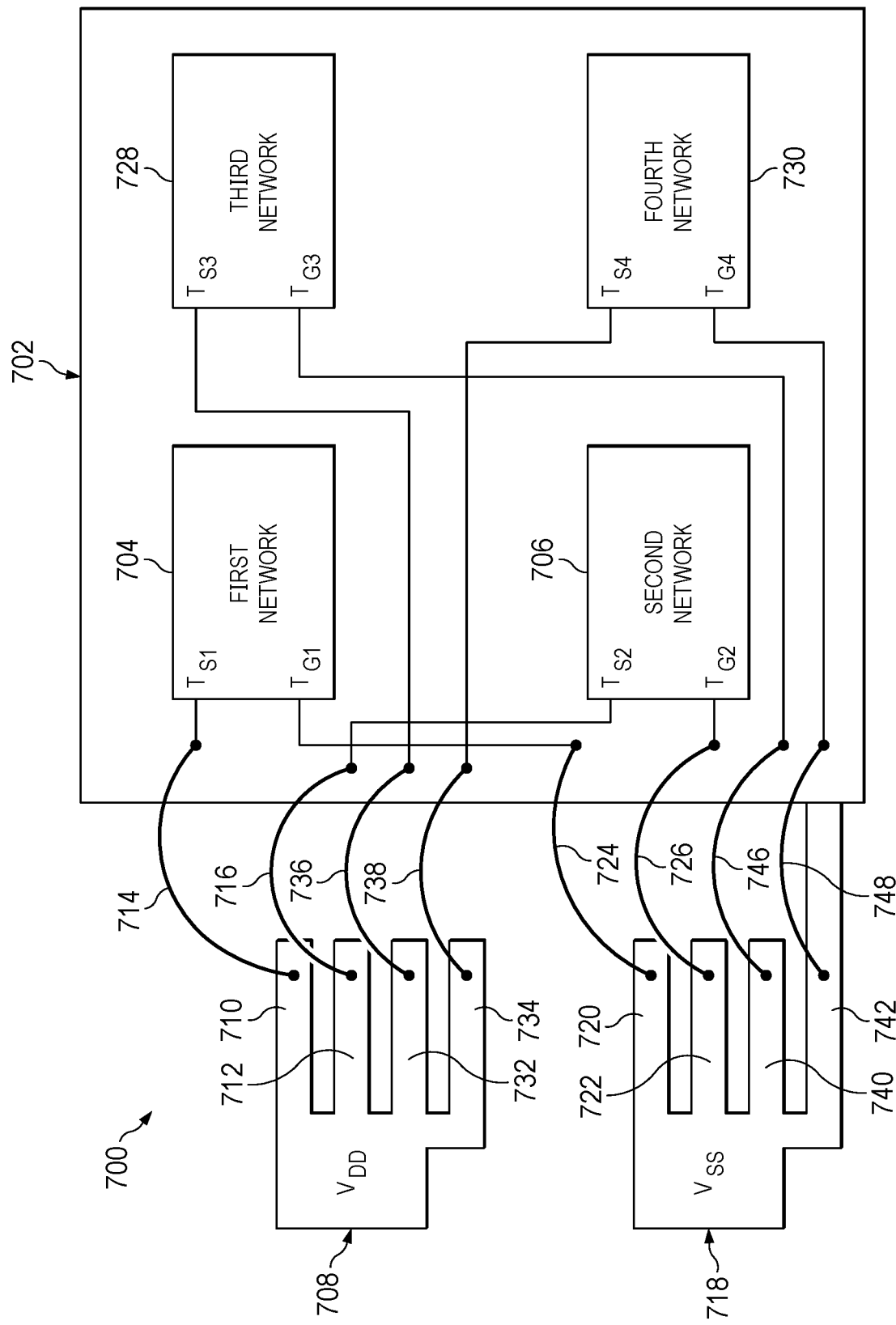

Although FIG. 2A illustrates a two-network arrangement with bifurcated supply and ground leads, a larger number of networks (e.g., three or four) can be accommodated with improved noise isolation between them by diverging supply and ground pins into a greater number of proximal ends than two. For example, the number of diverging end portions of the respective supply and ground leads can equal the number of networks to be isolated from each other. As an example having four networks, FIG. 7 shows an example portion 700 of an IC package with improved inter-network noise isolation provided by diverging leads. First network 704, second network 706, third network 728, and fourth network 730 are conductively coupled to lead frame 702. The first, second, third, and fourth networks 704, 706, 728, 730 can be, for example, fabricated in a single or in multiple semiconductor (e.g., silicon) IC dies. The lead frame 702 includes a supply pin 708 that is divided into a first supply lead 710, a second supply lead 712, a third supply lead 732, and a fourth supply lead 734 on the proximal end of the supply pin 708. The lead frame 702 also includes a ground pin 718 that is divided into a first ground lead 720, a second ground lead 722, a third ground lead 740, and a fourth ground lead 742 on the proximal end of the ground pin 718. The fourth ground lead 742 is conductively coupled to a ground plane of the lead frame 702 at a proximal end of the fourth ground lead 742. Distal ends of the supply and ground pins 708, 718 can be configured to be conductively coupled, for example, to a PCB as part of a larger system that incorporates the IC package of FIG. 7 and other components.

First network 704 has a first supply terminal $T_{S1}$ that is conductively coupled to the first supply lead 710 of the supply pin 708 via a first supply bond wire 714 (as illustrated) or bump bond (not illustrated). Second network 706 has a second supply terminal $T_{S2}$ that is conductively coupled to the second supply lead 712 of the supply pin 708 via a second supply bond wire 716 (as illustrated) or bump bond (not illustrated). Third network 728 has a third supply terminal $T_{S3}$ that is conductively coupled to the third supply lead 732 of the supply pin 708 via a third supply bond wire 736 (as illustrated) or bump bond (not illustrated). Fourth network 730 has a fourth supply terminal $T_{S4}$ that is conductively coupled to the fourth supply lead 734 of the supply pin 708 via a fourth supply bond wire 738 (as illustrated) or bump bond (not illustrated).

First network 704 has a first ground terminal $T_{G1}$ that is conductively coupled to the first ground lead 720 of the ground pin 718 via a first ground bond wire 724 (as illustrated) or bump bond (not illustrated). Second network 706 has a second ground terminal $T_{G2}$ that is conductively coupled to the second ground lead 722 of the ground pin 718 via a second ground bond wire 726 (as illustrated) or bump bond (not illustrated). Third network 728 has a third ground terminal $T_{G3}$ that is conductively coupled to the third ground lead 740 of the ground pin 718 via a third ground bond wire 746 (as illustrated) or bump bond (not illustrated). Fourth network 730 has a fourth ground terminal $T_{G4}$ that is conductively coupled to the fourth ground lead 742 of the ground pin 718 via a fourth ground bond wire 748 (as illustrated) or bump bond (not illustrated).

The first, second, third, and fourth networks 704, 706, 728, 730 are distinct electronic networks that each be on different IC dies, can all be on the same IC die, or can be on some combination of same and different dies. In different examples, one or more of the networks 704, 706, 728, 730 is (or are) in a digital section of a die, and the others of the networks are in an analog section of the same die. In other examples, one or more of the networks 704, 706, 728, 730 is (or are) in a first digital section of a die, and others of the networks 704, 706, 728, 730 are in a second (or third, or fourth) digital section(s) of the same die. In still other examples, one or more of the networks 704, 706, 728, 730 is in a first analog section of a die, and others of the networks 704, 706, 728, 730 are in a second (or third, or fourth) analog section of the same die.

As compared to an arrangement like the one shown in FIG. 1A, but with additional third and fourth networks directly connected to the same supply and ground pins 108, 118, in the star-connected arrangement of FIG. 7, sources of supply noise are reduced and heavy inrush current on one of the networks 704, 706, 728, 730 will not affect the operation of the others of the networks 704, 706, 728, 730 as much. The arrangement of FIG. 7 thus provides inter-network noise isolation improvement.

Figure 8:
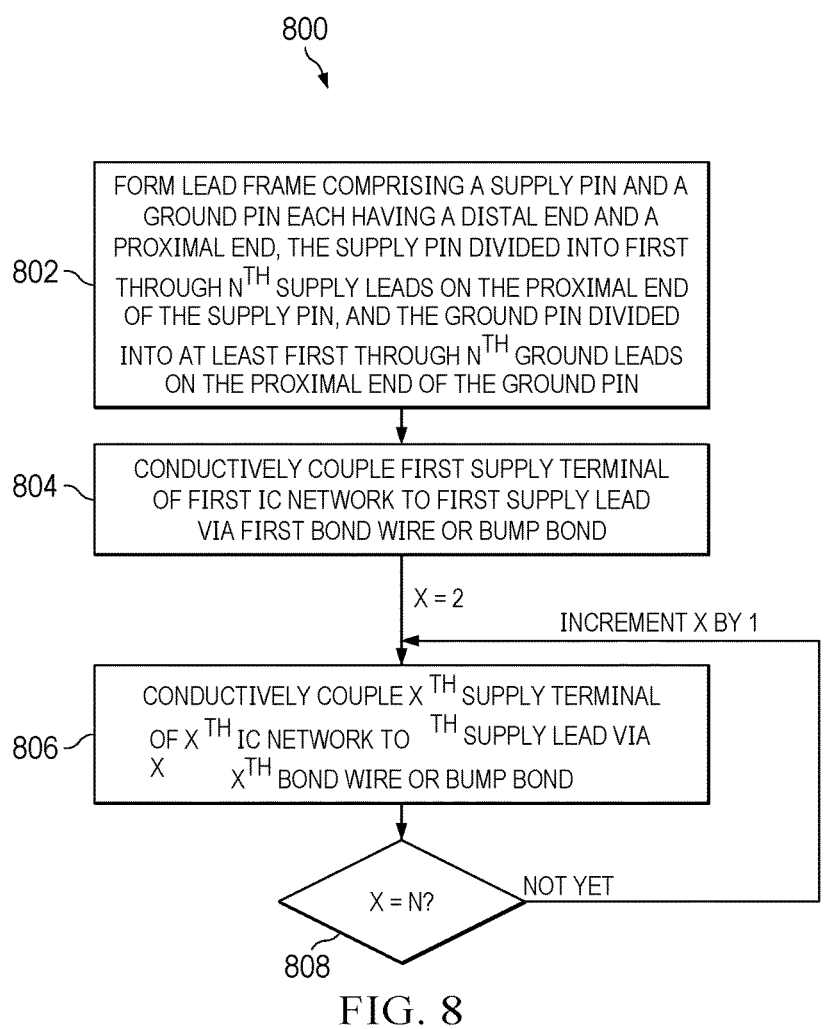
FIG. 8 is a flow chart of an example method of manufacturing a packaged IC having divided supply and ground pins for connection to each of multiple IC networks.

FIG. 8 is a flow chart of an example method 800 of manufacturing a packaged IC having divided supply and ground pins for connection to each of multiple IC networks. A lead frame is formed 802 to include a supply pin and a ground pin each having a distal end and a proximal end. In the formed lead frame, the supply pin is divided into at least first and second supply leads on the proximal end of the supply pin. In some examples, the supply pin can be further divided into more (e.g., third and/or fourth) supply leads on the proximal end of the supply pin. In the formed lead frame, the ground pin is likewise divided into at least first and second ground leads on the proximal end of the ground pin. In some examples, the ground pin can be further divided into more (e.g., third and/or fourth) ground leads on the proximal end of the ground pin. The divided supply and ground pins can be, as examples, as shown in any of FIGS. 2A, 3A, 3B, and/or 7.

A first supply terminal of a first IC network is conductively coupled 804 to the first supply lead via a first conductor (e.g., bond wire or bump bond). A first ground terminal of the first IC is conductively coupled to the first ground lead via a second conductor. A second supply terminal of a second IC network is conductively coupled to the second supply lead via a third conductor. A second ground terminal of the second IC network is conductively coupled to the second ground lead via a fourth conductor. If additional networks (e.g., third and/or fourth networks) are present and additional star-connected leads are desired 808, then the conductor connections can be repeated 806 to couple respective supply and ground terminals of the additional networks to respective divided proximal-end ground and supply leads. The bond wires can be, for example, as shown at 214, 216, 224, or 226 of FIG. 2A; 390 of FIG. 3B; 590 of FIG. 5; or 714, 716, 736, 738, 724, 726, 746, or 748 of FIG. 7.

A lead frame as described herein with diverging supply and ground leads, providing for star connections to these leads to different networks, can improve noise immunity of sensitive networks to noise generated by noisy networks in packaged IC devices. Such a lead frame can be used, for example, in an isolated USB repeater implemented in a peripheral device that connects to a USB host. Such peripherals can have a variety of applications, including consumer, automotive, aerospace, medical, and measurement applications. An isolated USB repeater implementing a star-connected lead frame as described herein can have the advantage of lower jitter.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. A packaged integrated circuit (IC) comprising:
    a lead frame having a supply pin and a ground pin, the supply pin including first and second supply leads extending from a proximal portion of the supply pin, and the ground pin including first and second ground leads extending from a proximal portion of the ground pin;
    a first IC network having a first supply terminal and a first ground terminal, a first conductor coupled between the first supply terminal and the first supply lead, and a second conductor coupled between the first ground terminal and the first ground lead; and
    a second IC network having a second supply terminal and a second ground terminal, a third conductor coupled between the second supply terminal and the second supply lead, and a fourth conductor coupled between the second ground terminal and the second ground lead.

2. The packaged IC of claim 1, wherein the first IC network and the second IC network are in a single IC die coupled to the lead frame.

3. The packaged IC of claim 1, wherein the first IC network is in a first IC die coupled to the lead frame and the second IC network is in a second IC die conductively coupled to the lead frame.

4. The packaged IC of claim 1, further comprising a third IC network coupled to the lead frame, a fifth conductor, and a sixth conductor, wherein:
    the supply pin further includes a third supply lead extending from the proximal portion of the supply pin,
    the ground pin further includes a third ground lead extending from the proximal portion of the ground pin,
    the third IC network includes a third supply terminal and a third ground terminal,
    the fifth conductor is coupled between the third supply terminal and the third supply lead, and
    the sixth conductor is coupled between the third ground terminal and the third ground lead.

5. The packaged IC of claim 4, further comprising a fourth IC network coupled to the lead frame, a seventh conductor, and an eighth conductor, wherein:
    the supply pin further includes a fourth supply lead extending from the proximal portion of the supply pin,
    the ground pin further includes a fourth ground lead extending from the proximal portion of the ground pin,
    the seventh conductor is coupled between the fourth supply terminal and the fourth supply lead, and
    the eighth conductor is coupled between the fourth ground terminal and the fourth ground lead.

6. The packaged IC of claim 1, wherein the packaged IC comprises a dual in-line package.

7. The packaged IC of claim 6, wherein the packaged IC comprises an isolated universal serial bus (USB) repeater.

8. A USB peripheral device comprising the isolated USB repeater of claim 7.

9. A method of manufacturing a packaged integrated circuit (IC), the method comprising:
forming a lead frame comprising a supply pin and a ground pin, the supply pin including first and second supply leads extending from a proximal portion of the supply pin, the ground pin including first and second ground leads extending from a proximal portion of the ground pin;
coupling a first supply terminal of a first IC network to the first supply lead via a first conductor;
coupling a first ground terminal of the first IC network to the first ground lead via a second conductor;
coupling a second supply terminal of a second IC network to the second supply lead via a third conductor; and
coupling a second ground terminal of the second IC network to the second ground lead via a fourth conductor.

10. The method of claim 9, wherein the first IC network and the second IC network are in a single IC die conductively coupled to the lead frame.

11. The method of claim 9, wherein the first IC network is in a first IC die conductively coupled to the lead frame and the second IC network is in a second IC die conductively coupled to the lead frame.

12. The method of claim 9, wherein the supply pin is divided into at least first, second, and third supply leads on the proximal end of the supply pin, and the ground pin is divided into at least first, second, and third ground leads on the proximal end of the ground pin, the method further comprising:
coupling a third supply terminal of a third IC network to the third supply lead via a fifth conductor; and
coupling a third ground terminal of the third IC network to the third ground lead via a sixth conductor.

13. The method of claim 12, wherein the supply pin is divided into at least first, second, third, and fourth supply leads on the proximal end of the supply pin, and the ground pin is divided into at least first, second, third, and fourth ground leads on the proximal end of the ground pin, the method further comprising:
coupling a fourth supply terminal of a fourth IC network to the fourth supply lead via a seventh conductor; and
coupling a fourth ground terminal of the fourth IC network to the fourth ground lead via an eighth conductor.

14. The method of claim 9, wherein the packaged IC is a dual in-line package.

15. The method of claim 9, wherein the packaged IC is an isolated universal serial bus (USB) repeater.

* * * * *